(12) United States Patent
Ikeda

(10) Patent No.: US 6,864,463 B2
(45) Date of Patent: Mar. 8, 2005

(54) SUBSTRATE PROCESSING APPARATUS AND SEMICONDUCTOR DEVICE PRODUCING METHOD

(75) Inventor: Fumihide Ikeda, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/210,558

(22) Filed: Jul. 31, 2002

(65) Prior Publication Data

US 2003/0027364 A1 Feb. 6, 2003

(30) Foreign Application Priority Data

Aug. 2, 2001 (JP) ........................................ 2001-234443

(51) Int. Cl.[7] ................................................. F27B 5/14
(52) U.S. Cl. ...................... 219/390; 219/405; 219/490; 219/502; 219/411; 219/505; 219/497; 392/418; 392/416
(58) Field of Search ................................. 219/390, 405, 219/411, 497, 502, 505, 412–413, 490; 392/416, 418; 118/724, 725, 501; 156/345; 438/14, 795

(56) References Cited

U.S. PATENT DOCUMENTS

| | | | | |
|---|---|---|---|---|
| 5,315,092 A | * | 5/1994 | Takahashi et al. | .......... 219/497 |
| 5,334,251 A | * | 8/1994 | Nashimoto | .................. 118/725 |
| 5,814,365 A | | 9/1998 | Mahawili | |
| 5,951,896 A | | 9/1999 | Mahawili | |
| 6,090,212 A | | 7/2000 | Mahawili | |

FOREIGN PATENT DOCUMENTS

JP          11-329992          11/1999

* cited by examiner

Primary Examiner—Shawntina Fuqua
(74) Attorney, Agent, or Firm—Hogan & Hartson, LLP

(57) ABSTRACT

Emissivity of a substrate is measured at least before the substrate is heated, heating operation of the substrate is controlled under a heating condition corresponding to the emissivity, and the substrate is processed.

5 Claims, 4 Drawing Sheets

SUBSTRATE PROCESSING APPARATUS AND SEMICONDUCTOR DEVICE PRODUCING METHOD

BACKGROUND OF THE INVENTION

1. Field of the Invention

The present invention relates to a substrate processing apparatus and a producing method of a semiconductor device, and more particularly to a wafer heating temperature control method and system in a semiconductor device producing apparatus and a producing method of a semiconductor device.

2. Description of the Related Art

Conventionally, when a wafer is heated in a RTP (Rapid Thermal Processing) apparatus which heats a wafer using radiation energy such as halogen lamp, with a constant such as PID of a temperature controlling system being set, a temperature-rise test is carried out a plurality of times so that a wafer temperature is not hunted or over/under shot when a temperature of the wafer is increased or stabilized, a temperature control parameter such as the PID constant is optimized and then, a product wafer is processed. In this case, if a kind of a wafer is different (for example, a kind of a film formed on a surface of a wafer is different), emissivity of a wafer heating surface is changed. Therefore, it is necessary to set a heating condition whenever a kind of the wafer is changed, which lowers productivity. Further, if a processing condition such as a processing pressure is changed, it is likewise necessary to set the heating condition.

In order to solve such problems, there is disclosed, in Japanese Patent Application Laid-open No. 11-32992, a method in which a substrate is once heated before it is processed, a temperature changing speed of the substrate caused by this heating operation is measured, a kind of the substrate is judged from a degree of this temperature changing speed, and based on this judging result, the substrate is processed in accordance with a control parameter table (a target temperature profile and a PID parameter) corresponding to the kind of the substrate.

In this method, however, it is necessary to once heat the substrate before it is processed, and there still is a problem that the productivity is deteriorated. Further, since the heating characteristics of the substrate are also changed when the substrate is heated during processing, there is a problem that the precision is deteriorated with only measurement before processing.

SUMMARY OF THE INVENTION

Therefore, it is a main object of the present invention to provide a substrate processing apparatus and a producing method of a semiconductor apparatus in which it is possible to easily set a heating condition and to enhance productivity even if a kind of a substrate to be processed is different.

It is another object of the invention to provide a substrate processing apparatus and a producing method of a semiconductor device in which it is possible to easily reset a heading condition even if heating characteristics of a substrate are changed when the substrate is heated during processing so that the heating operation can be controlled precisely.

According to a first aspect of the present invention, there is provided a substrate processing apparatus wherein emissivity of a substrate is measured at least before the substrate is heated, heating operation of the substrate is controlled under a heating condition corresponding to the emissivity, and the substrate is processed.

Preferably, the emissivity measurement is measurement of emissivity of a device forming surface of the substrate.

Preferably, the emissivity of the substrate is obtained even during the heating operation of the substrate, and the substrate is processed while varying the heating control of the substrate based on a heating condition corresponding to the emissivity obtained during the heating operation of the substrate. In this case, it is preferable that a measurement value of a temperature sensor which measures a temperature of the substrate is also corrected by the measured emissivity value.

Preferably, the heating condition includes the obtained emissivity value, a substrate processing pressure value, and a PID constant determined based on a temperature when the emissivity is measured.

According to a second aspect of the present invention, there is provided a producing method of a semiconductor apparatus wherein emissivity of a substrate is measured at least before the substrate is heated, heating operation of the substrate is controlled under a heating condition corresponding to the emissivity, and the substrate is processed.

In the above-mentioned substrate processing apparatus and semiconductor device producing method, the substrate is preferably a semiconductor wafer.

The substrate processing apparatus and the semiconductor device producing method of the present invention are preferably applied when substrates are thermally processed one by one.

In a heating system utilizing radiation energy such as an RTP apparatus, heating characteristics of a wafer are changed when emissivity of the wafer is changed because a kind of the wafer to be processed is different or when a process condition such as a processing pressure is changed. Therefore, it is necessary to change a PID parameter of a temperature control program each time. Conventionally, since it takes much time to set a condition, productivity is deteriorated.

In the present invention, emissivity of the substrate is measured at least before the substrate is heated, and the substrate is processed while controlling the heating operation of the substrate under a heating condition corresponding to the emissivity. In the present invention, the emissivity of the substrate is measured before the substrate is heated, a heating condition corresponding to the emissivity is set to control the heating operation of the substrate. Therefore, it is unnecessary to heat the substrate for determine the heating condition, and it is only necessary to measure the emissivity of the substrate. Thus, it is possible to largely shorten the time for setting the heating condition, and to enhance the productivity.

In order to set the heating condition corresponding to the measured emissivity and to control the heating operation of the substrate, preferably, a temperature control table corresponding to the emissivity of the substrate which was previously measured before heating the substrate is prepared, a heating condition is automatically selected from the temperature control table at the time of processing of a wafer, the heating condition is automatically loaded into the wafer temperature control program, and the substrate is heated.

Preferably, the temperature control table includes the emissivity and a temperature control constant such as a PID corresponding to the emissivity.

When a process condition such as a processing pressure is also changed, preferably, the temperature control table includes the emissivity and a temperature control constant such as a PID corresponding to the processing pressure.

In this case, there is preferably provided a plurality of temperature control tables including emissivity values of a substrate and process conditions such as process pressures.

If the substrate is heated, the emissivity is varied and thus, the emissivity is measured in real time even during the processing, and it is possible to precisely control a temperature by changing the heating condition (PID constant) even during the heating operation. Therefore, preferably, the emissivity of the substrate is obtained not only before the substrate is heated but also while the substrate is being heated, and the substrate is processed while varying the control of the heating operation of the substrate based on the heating condition corresponding to the emissivity obtained while the substrate is heated.

For example, in the case of a semiconductor silicon wafer, if the emissivity is varied by 0.1, a temperature of the wafer is varied by 10 to 20° C. and thus, it is preferable control the temperature in real time.

When the emissivity is measured in real time in this manner to change the heating condition, it is preferable to correct a radiation thermometer also.

When the emissivity of the substrate is obtained not only before the substrate is heated but also while the substrate is being heated, and the substrate is processed while varying the control of the heating operation of the substrate based on the heating condition corresponding to the emissivity obtained while the substrate is heated, the temperature control table of the heating condition preferably includes an emissivity value, a substrate processing pressure value, a temperature at the time of measurement of the emissivity and a temperature control constant such as a PID constant determined based on these values.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Next, one embodiment of the present invention will be explained with reference to the drawings.

Figure 1:
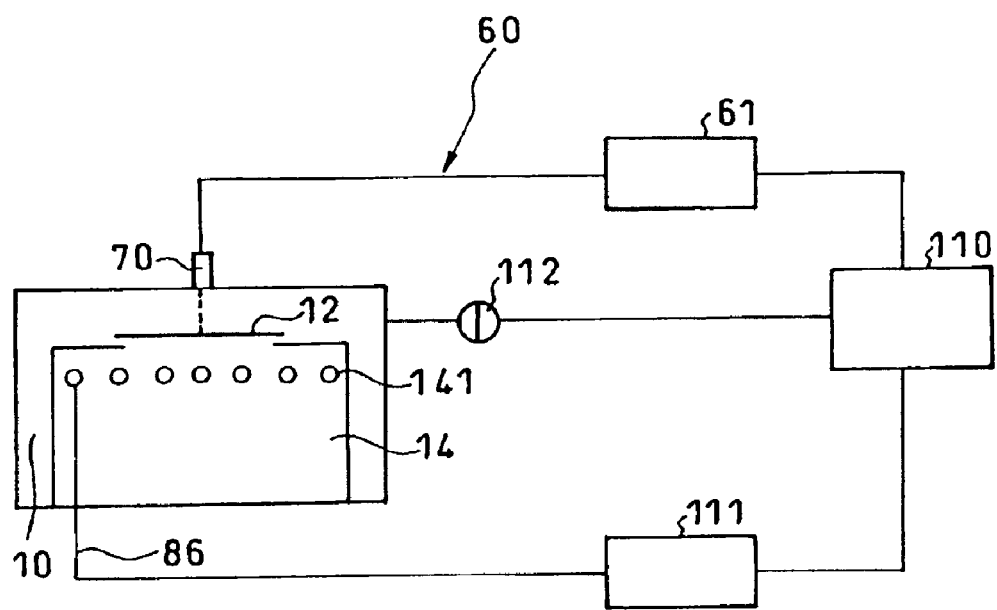
FIG. 1 is a schematic diagram of a substrate processing apparatus according to one embodiment of the present invention.

FIG. 1 is a schematic diagram of the substrate processing apparatus of the one embodiment of the present invention.

This substrate processing apparatus includes a heater assembly 14 in a processing reactor (process chamber) 10.

The heater assembly 14 is provided therein with lamps 141 such halogen lamps. A pressure sensor 112 for measuring a pressure in the process reactor 10 is mounted to the process reactor 10. A noncontact emissivity measurement assembly 60 is mounted to the process reactor 10. The emissivity measurement assembly 60 includes a photon density sensor 70 and a processor (wafer emissivity measurement instrument) 61. The processor 61 and a pressure sensor 112 are connected to a temperature control controller 110. The temperature control controller 110 is connected to a power control unit 111, and the power control unit 111 is connected to the lamps 141 through an electrical feedthrough 86. A semiconductor substrate (semiconductor wafer) 12 is heated from its back face by the lamps 141 such as the halogen lamps in the heater assembly 14. Emissivity of an upper face (device forming face) of the wafer is measured by the photon density sensor 70 and then, the measured value is input to the temperature control controller 110 through the processor 61. A pressure in the process reactor 10 is measured by the pressure sensor 112, and the measured value is input to the temperature control controller 110.

The emissivity of the substrate and a heating condition of the substrate corresponding to the emissivity are previously obtained before the substrate is heated and also while the substrate is being heated, and the temperature control table of the heating condition as shown in Table 1 is previously prepared. This temperature control table of the heating condition includes an emissivity value, a substrate processing pressure value, a temperature at the time of measurement of the emissivity and a temperature control constant such as a PID constant determined based on the these values.

TABLE 1

| | Processing Pressure (Pa) | Temperature at the time of emissivity measurement (° C.) | PID Constant |
|---|---|---|---|
| Emissivity Value 1 | $A_1$ | $B_1$ to $C_1$ (before substrate heating) | $P{:}p_1$ $I{:}i_1$ $D{:}d_1$ |
| | | $B_2$ to $C_2$ | $P{:}p_2$ $I{:}i_2$ $D{:}d_2$ |
| | | ... | ... |
| | $A_2$ | ... | ... |
| | ... | ... | ... |
| Emissivity Value 2 | ... | ... | ... |
| ... | ... | ... | ... |

When the semiconductor substrate 12 is processed, the emissivity of the semiconductor substrate 12 is obtained before the substrate is heated and also while the substrate is heated, a heating condition (PID constant) is automatically selected from a temperature control table shown in Table 1 from the measured emissivity value, the substrate processing pressure and the temperature at the time of the measurement of the emissivity, and the heating condition is automatically loaded into the wafer temperature control program of the temperature control controller 110, thereby heating the semiconductor substrate 12.

Next, the reactor 10, which is preferably used in the present embodiment, for processing a semiconductor substrate and the emissivity measurement assembly 60 which permits emissivity measurement of the semiconductor sunstrate 12 will be explained in detail.

Figure 2:
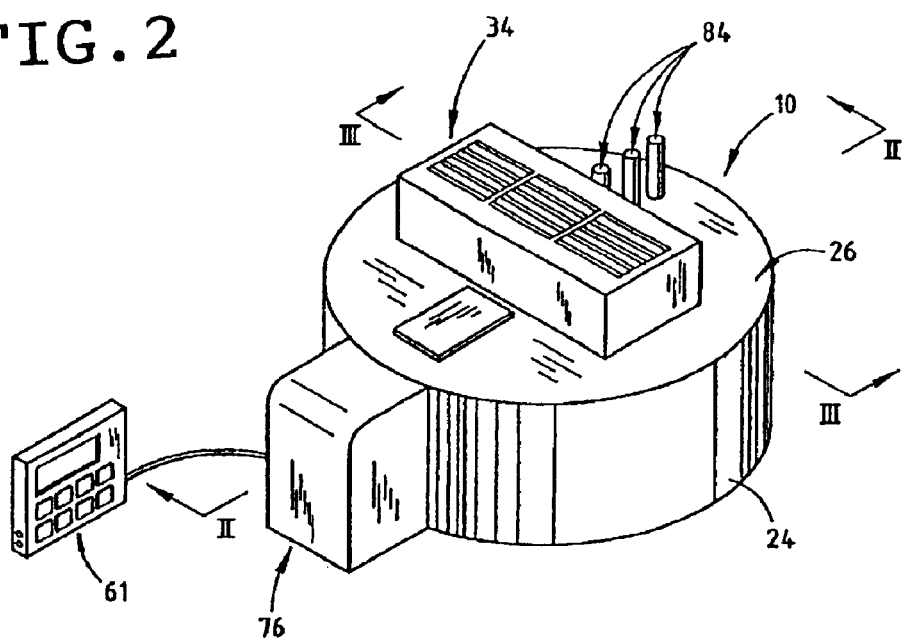
FIG. 2 is a perspective view of a chemical vapor deposition chamber of a substrate processing apparatus according to the one embodiment of the present invention.
Figure 3:
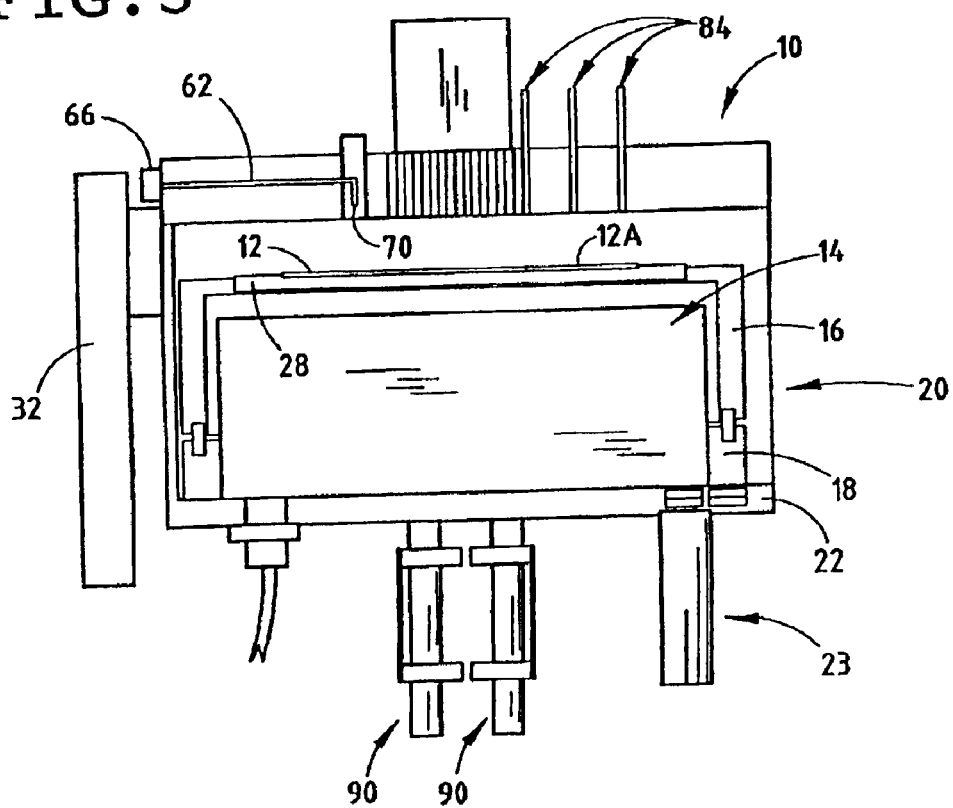
FIG. 3 is a schematic sectional view taken along line II—II of FIG. 2.

Referring to FIGS. 2 and 3, a reactor for processing semiconductor substrates is generally indicated by the numeral 10. In the illustrated embodiment, the reactor 10 comprises a single wafer processing reactor that is suitable for performing various fabrication processes on the semiconductor substrate 12, such as a semiconductor wafer. The reactor 10 is particularly suitable for thermal processing of a semiconductor wafer. Such thermal processes include thermal annealing of a semiconductor wafer and thermal reflow of boro-phosphorous glasses, and chemical vapor deposition of thin film applications, such as high temperature oxide, low temperature oxide, high temperature nitride, doped and undoped polysilicon, silicon epitaxial and tungsten metal and tungsten silicide films, in the fabrication of a semiconductor device. The control of these processes depends on the control of gas flow, gas pressure, and wafer temperature. As will be described in more detail, reactor 10 includes a heater assembly 14, which delivers heat to the substrate 12 in a uniform manner, a gas injection assembly 34, which selectively delivers and directs gas to a discrete region of the substrate in a uniform and controlled manner, and an emissivity measurement assembly 60, which permits continuous emissivity measurement of the average surface area of the device side of the substrate during processing so that the amount and/or the profile of the heat being delivered to the substrate during processing may be adjusted.

As best seen in FIG. 3, reactor 10 includes a heater assembly 14, which is enclosed in a heater housing 16. Heater assembly 14 is designed to deliver radiant heat to substrate 12 in a manner such that the temperature in the substrate is substantially uniform. In a preferred form, heater assembly 14 includes an array of heating elements such as linear tungsten-halogen lamps (not shown), which emit peak radiation at 0.95 microns and are layered to form a plurality of heating zones, which provide a concentrated heating profile with a greater amount of heat being applied to the outer perimeter of the substrate than the center of the substrate. For further details of heater assembly 14, reference is made to pending U.S. patent application entitled RAPID THERMAL PROCESSING HEATER TECHNOLOGY AND METHOD OF USE, filed on Dec. 4, 1996, Ser. No. 08/759,559, which is incorporated herein by reference in its entirety. It should be understood that other heaters may be used in reactor 10, preferably heaters which deliver heat to substrate in a substantially uniform manner.

Heater assembly 14 is enclosed in heater housing 16, which is mounted on a rotatable base 18. Heater housing 16 is made from a suitable material, such as a ceramic, graphite or, more preferably, silicon graphite coated graphite, or the like. Heater assembly 14, heater housing 16, and rotatable base 18 are enclosed and vacuum sealed in an outer, reactor housing 20 and are supported on a base wall 22 of reactor housing 20. Reactor housing 20 may be formed from a variety of metal materials. For example, aluminum is suitable in some applications, whereas stainless steel is more suitable in others. The choice of material is driven by the type of chemicals used during the deposition process and their reactivity with respect to the metal of choice, as is understood by those persons skilled in the art. The chamber walls are typically water cooled to approximately 45–75 degrees Fahrenheit by a conventional recirculating chilled water flow system, which is commonly known in the art.

Figure 4:
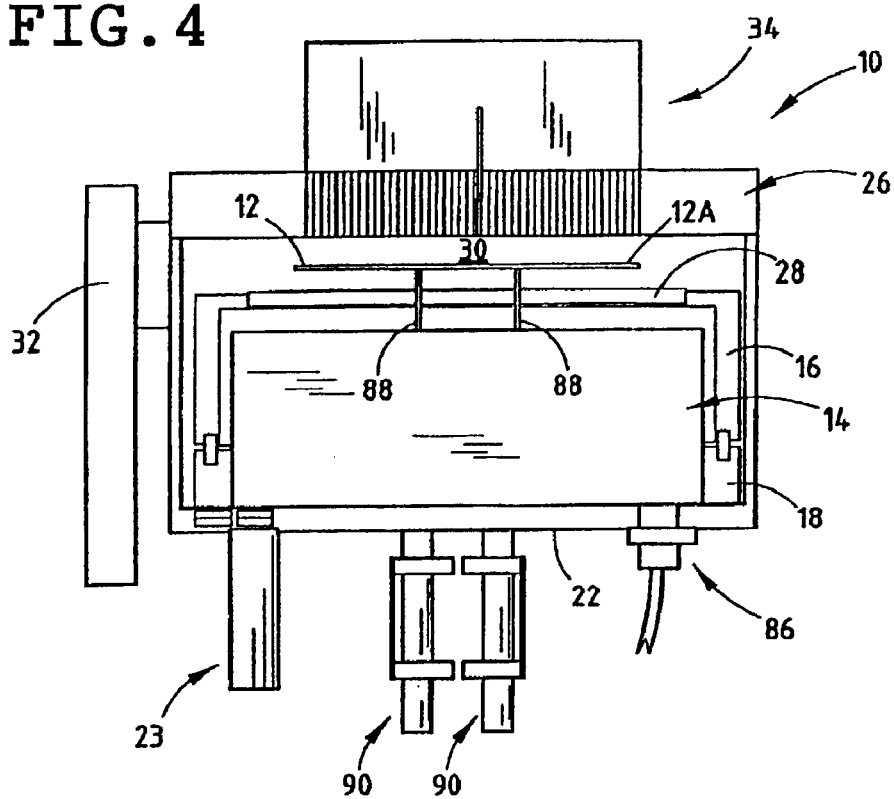
FIG. 4 is an enlarged sectional view taken along section line III—III of FIG. 2 illustrating a gas injection system.

Referring to FIGS. 3 and 4, base 18 and housing 16 are rotatably supported on base wall 22 of housing and are preferably rotated using a conventional magnetically coupled drive mechanism 23, or other suitable driving device which can impart rotation to base 18 through a vacuum seal. The revolutions per minute (rpm) of base 18 and housing 16 may be preset, for example preferably in a range of 5 to 60 rpm depending on the specific process, again as is understood by those persons skilled in the art.

As best seen in FIG. 2, reactor housing 20 includes a cylindrical outer wall 24 and a cover 26 which extends over cylindrical outer wall 24. Substrate 12 is supported in reactor housing 20 on a platform 28, which is made from a suitable material, such as silicon carbide coated graphite, quartz, pure silicon carbide, alumina, zirconia, aluminum, steel, or the like, and is oriented with its device side 12a directed toward cover 26. For details of a preferred embodiment of platform 28, reference is made to pending U.S. patent application entitled A SUBSTRATE PLATFORM FOR A SEMICONDUCTOR SUBSTRATE DURING RAPID HIGH TEMPERATURE PROCESSING AND METHOD OF SUPPORTING A SUBSTRATE filed on Aug. 15, 1997, Ser. No. 08/912,242, by Imad Mahawili, which is herein incorporated by reference in its entirety.

Platform 28 is seated and supported in a recess or central opening 16a provided in a top wall 27 of housing 16 and spaced from cover 26 and substantially extends over and completely cover opening 16a. Consequently, heater assembly 14 is completely enclosed by heater housing 16 and platform 28, which when placed on top of the housing 16, completes the enclosure of heater assembly 14. Platform 28 can accommodate various substrate sizes and, in particular, can accommodate substrates with 150, 200 and 300 mm diameters. The space between platform 28 and the lower surface 26a of cover 26 defines an evacuated process chamber 30, which is evacuated through the vacuum exhaust parts placed in a gas injector assembly 34. Preferably, substrate 12 is introduced into evacuated chamber 30 through a chamber valve 32 and is placed on platform 28 by a conventional wafer transport device (not shown), such as an automated transport robot.

Figure 5:
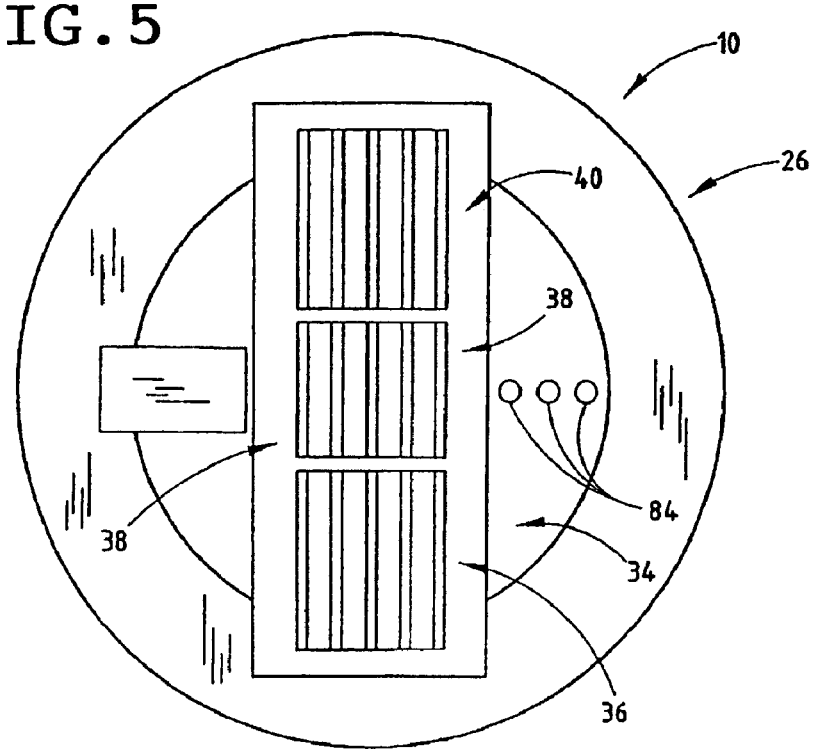
FIG. 5 is a top plan view of a chamber cover.
Figure 6:
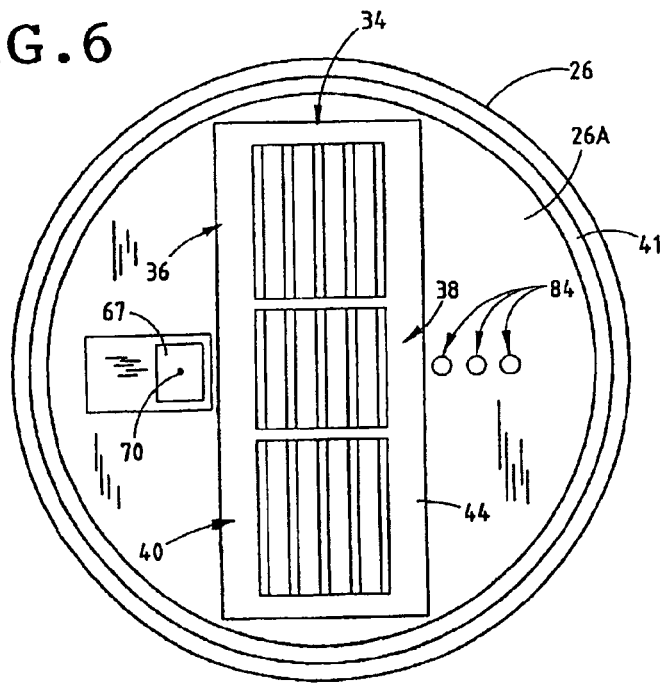
FIG. 6 is a bottom plan view of the chamber cover.
Figure 7:
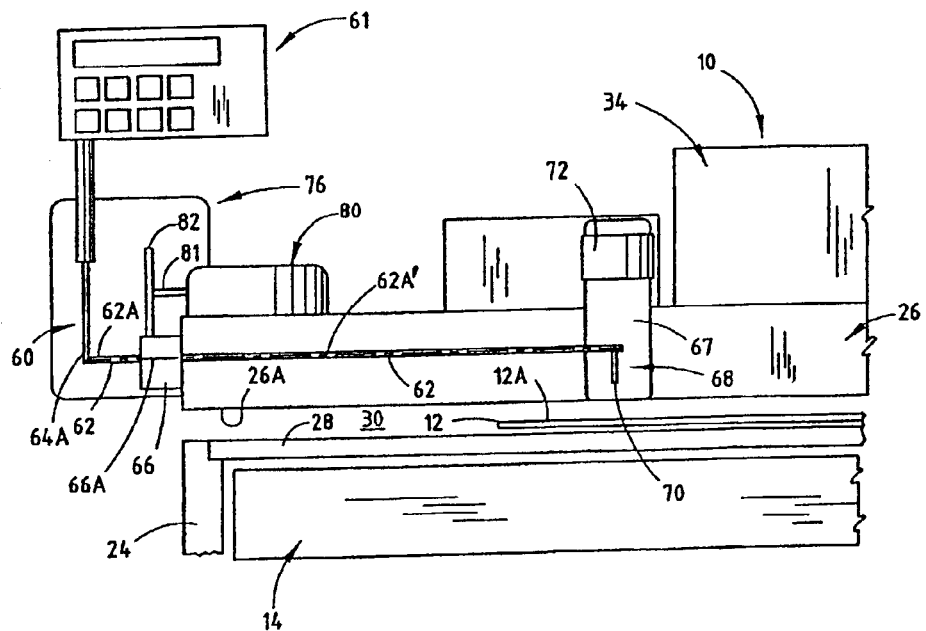
FIG. 7 is a schematic representation of an emissivity measurement system cooperating with a chemical vapor deposition chamber of FIG. 2.

Referring to FIGS. 5 and 6, reactor 10 further includes gas injection manifold 34 which injects one or more gases onto a localized or discrete region of the substrate surface wherein thin film deposition takes place. Gas injection manifold 34 is positioned in cover 26 and includes a plurality of reactive gas injection segments 36, 38, and 40, an inert gas injection ring 41, and an exhaust manifold 44. Injection ring 41 injects an inert gas, preferably nitrogen or the like, into processing chamber 30 and directs the inert gas to the perimeter of the substrate to form a gas barrier so that the reactive gases injected through gas injection segments 36, 38, and 40 are confined to the area of the substrate directly below the respective segments 36, 38, and 40 due to the placement of vacuum exhaust manifold 44 adjacent gas injection segments 36, 38, and 40.

As best seen in FIG. 6, gas injection segments 36, 38, and 40 are aligned in a central region of cover 26 to inject one or more gases, reactive and inert gases, into chamber 30. Exhaust manifold 44 extends along and adjacent gas injection segments 36, 38, and 40 so that gases directed onto substrate 12 are confined to a discrete area across the substrate, which preferably extends from one side or edge of the substrate to an opposed side or edge of substrate 12. It should be understood that gases injected by gas injection segments 36, 38, and 40 are directed in the general direction substrate 12 and any stray gas molecules which migrate near the region under exhaust manifold 44 will be exhausted from processing chamber 30. Therefore, the gases introduced by gas injection segments 36, 38, and 40 are confined to a discrete volume of processing chamber 30 and to a discrete area of substrate 12.

Gas injection segments 36, 38, 40 may be associated with an injection of a specific gas. For example, gas injection zones 36 and 40 may be used to inject gas A while gas injection zone 38 may be used to inject gas B. In this manner, two reactive gases (A and B) may be injected that mix and react on the device side of the substrate. It should be understood by those skilled in the art that a wide variety of gasses can be employed and selectively introduced through the orifices 42, for example, hydrogen, argon, tungsten hexaflouride, or the like, to process substrate 12.

As best seen in FIG. 6, gas injection manifold 34 includes exhaust manifold 44. As described above, exhaust manifold 44 extends around segments 36, 38, and 40 to provide an additional boundary beyond which the reactive gases can not extend. In addition to removing unreacted gases from processing chamber 30, exhaust manifold also assists in the prevention of back flow contamination of the reactant gases. In combination with injection ring 41, exhaust manifold 44 controls the film deposition on substrate 12 in a manner which results in localized area of film deposition and, therefore, permits the use of an emissivity measurement system, described below.

Reactor 10 further includes a non-contact emissivity measurement system 60 for measuring the emissivity and calculating the temperature of substrate 12 during the various fabrication processes. Emissivity measurement system 60 includes a central processing unit 61 and a pair of fiber optic communication cables 62 and 64 which are coupled together and coupled to central processing unit 61. Fiber optic cable 62 preferably comprises a sapphire fiber optic communication cable and extends into cover 26 of reactor housing 20 through a rigid member 66, which provides a vacuum feedthrough to reactor 10. Cable 62 extends through member 66 into a cavity 67 provided in cover 26, which is positioned above platform 28 and substrate 12. Member 66 is preferably a cylindrical drive shaft and, more preferably, a stainless steel cylindrical drive shaft, and is rotatably mounted in cover 26. One end 68 of fiber optic cable 62 is bent or oriented for directing at substrate 12 and light source 72, as will be more fully explained below, with the photon sensing end of cable 62 forming a fiber optic photon density sensor or probe 70. The second end portion of cable 62 extends through shaft 66 and into a fiber optic housing 76, which is mounted to an exterior surface of cylindrical wall 24 of housing 20. Distal end 62a of cable 62 is slip attached to a distal end 64a of cable 64, which preferably comprises a quartz fiber optic communication cable, in fiber optic housing 76.

The other end of fiber optic communication cable 64 is then connected to processor 61. In this manner, when cable 62 is rotated, cable 62 remains in communication with cable 64 and processing unit 61 through the slip connection between the two communication cables. Processor 61 preferably comprises a measuring instrument, for example a Luxtron Model 100, which converts the photon density measured by fiber optic sensor 70 into an electrical current, which is displayed by processor 61.

The position of fiber optic sensor 70 is changed by a driver 80, preferably a motor, which is housed in fiber optic housing 76 and which is drivingly coupled to shaft 66. Motor 80 includes a drive shaft 81 and a drive wheel 82, which engages and rotates shaft 66 about its longitudinal axis 66a. Motor 80 rotates shaft 66, which imparts rotation to fiber optic cable 62, so that the orientation of fiber optic sensor 70 is moved between a first position wherein the fiber optic sensor 70 is directed generally upward toward light source 72 and a second position in which it is directed generally downward to substrate 12. Therefore, end 68 of communication cable 62 is preferably oriented at a right angle with respect to the horizontal axis 62a of communication cable 62. In this manner sensor 70 can detect the photon density emitted from light source 72 and of the reflected light off substrate. Light source 72 preferably comprises a white light source, which emits light at a wavelength so that the wafer optical transmission is minimized, preferably, for example at a 0.95 micron wavelength. Emissivity measurement system 60 determines the temperature of substrate 12 by comparing of the radiation emitted by source 72 with that of the radiation emitted by substrate 12. Source 72 preferably includes at least one lamp which is a similar construction to the lamps used in heater assembly 14, which are described in pending U.S. patent application entitled RAPID THERMAL PROCESSING HEATER TECHNOLOGY AND METHOD OF USE.

Preferably, photon density sensor 70 is spaced and, preferably, located radially outward from gas injection system 34 and exhaust manifold 44 so that the gas, which is injected into chamber 30 and onto substrate 12, does not interfere with the temperature reading of emissivity sensor 70. Since heater assembly 14 is completely enclosed by the heater housing 16, there is no leakage of light from heater assembly 14 into deposition chamber 30, which could impact the readings taken by emissivity sensor 70. This eliminates probe characteristics matching or corrections associated with the conventional temperature measuring devices with two probes. After substrate 12 is placed on platform 28, housing 16 and platform 28 are rotated during processing by drive mechanism 23. When the emissivity of substrate 12 is to be measured, sensor 70 is rotated to view light source 72 directly above substrate 12 and light source 72 is turned on. Sensor 70 measures the incident photon density from light source 72. While light source 72 is still on, sensor 70 is rotated from its first position to its second position to view substrate 12 directly below light source 72 while it is rotating. In this position, sensor 70 measures the reflected photon density off the device side 12a of substrate 12. Light source 72 is then turned off. While still viewing substrate 12 directly, sensor 70 measures the emission of photons from heated substrate 12. This last value is subtracted from the reflected radiation value. According to Plank's law, the energy emitted off a given surface is related to the temperature of the surface to the fourth power. The proportionality constant consists of the product of the Stephen-Boltzmann constant and the surface emissivity. Therefore, the surface emissivity is preferably used when determining the temperature of the surface in non-contact methods. The following equations are used to calculate the total hemispherical reflectivity of device side 12a of substrate 12 and, subsequently, the emissivity, as given by Kirchoffs law:

$$\text{Wafer Reflectivity} = \text{Reflected Light Intensity}/\text{Incident Light Intensity} \quad (1)$$

$$\text{Emissivity} = (1 - \text{Wafer Reflectivity}) \quad (2)$$

Once the substrate emissivity is calculated, the substrate temperature is then obtained from Plank's equations. This technique is also used when the substrate is hot and, under such application, the base thermal emission from the substrate is subtracted prior to executing the above calculation. Preferably, sensor 70 is left in the second position or wafer viewing position and, thus, constantly yields emissivity data every time source lamp 72 is turned on.

Since substrate 12 is rotating, sensor 70 collects photon density off the device side 12a of the substrate 12 during such rotation and, therefore, measures the reflection from the averaged surface topology of varied device structures that might be lithographed onto the substrate. Furthermore, since the emissivity measurement is performed during the process cycle including thin film deposition process, the instantaneous changes of emissivity are monitored and temperature corrections are performed dynamically and continuously. Once the emissivity is calculated, it is sent into the temperature control segment of the processor 21 where the emissivity value is used in the application of the Plank equation.

Reactor 10 further includes a plurality of optical fiber temperature measurement probes 84, which are fixed to cover 26 and constantly collect photon density emitted from device side 12*a* of substrate device 12 during all processing conditions. The temperatures measured by probes 84 are sent to the main control computer to compare them to a set temperature and any deviation is computed and transformed into a control current to drive a standard off-the-shelf SCR current relay to deliver the proportional power to each of the lamp zones within heater assembly 14. Preferably, reactor 10 includes three probes (84) which are positioned to measure the temperature of different parts of the wafer, which assures temperature uniformity during the processing cycle.

Temperature readings of substrate 12 calculated by central processing unit 61 are preferably used as input into a control system (the temperature control controller 110 and the power control unit 111 shown in FIG. 1) which monitors and controls the output of heater assembly 14. The control system is coupled to heater assembly 14 through an electrical feedthrough 86 which extends to the base wall 22 of reactor housing 20. In order to maintain the vacuum in reactor 10, feedthrough 86 is sealed by an O-ring or sealed using other conventional sealing devices or methods.

After semiconductor substrate 12 has been processed, substrate 12 is raised off platform 28 by a plurality of lifter pins 88 which protrude through and lift substrate 12 off platform 28 for automatic loading and unloading of substrate 12 within reactor 10. Lifter pins 88 are raised and lowered by magnetically coupled wafer lifters 90, which are conventionally known in the art. Pins 88 are centrally located in housing 16 and project through a central portion of the heater assembly 14 and through a central portion of platform 28. Similarly, to maintain the vacuum in chamber 30, lifter pins 88 extend through O-ring seals provided in the base wall 22 of housing 20.

In preferred form, at least three lifter pins 88 are provided. In the most preferred form, four lifter pins 88 are provided, and platform 28 includes a corresponding number of openings to enable lifter pins 88 to protrude through and lift substrate 12 off platform 28 for automatic loading and unloading of substrate 12. It can be appreciated that lifter pins 88 can only be operated when housing is positioned so that the openings in platform 28 are aligned with lifter pins 88, for example in a "HOME" position.

The entire disclosure of Japanese Patent Application No. 2001-234443 filed on Aug. 2, 2001 including specification, claims, drawings and abstract and the entire disclosure of the U.S. Pat. No. 5,814,365 are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A substrate processing apparatus that processes a substrate, comprising:

a measuring device which measures an emissivity of a device forming surface of the substrate at least before the substrate is heated, and a controller which controls a heating operation of the substrate under a heating condition corresponding to the emissivity.

2. A substrate processing apparatus as recited in claim 1, wherein the emissivity of the substrate is obtained even during the heating operation of the substrate, and wherein the substrate is processed while varying the heating control of the substrate based on a heating condition corresponding to the emissivity obtained during the heating operation of the substrate.

3. A substrate processing apparatus that processes a substrate, wherein emissivity of the substrate is measured at least before the substrate is heated, and wherein a heating operation of the substrate is controlled under a heating condition corresponding to the emissivity, and the substrate is processed, wherein the heating condition includes the obtained emissivity value, a substrate processing pressure value, and a PID constant determined based on a temperature when the emissivity is measured.

4. A substrate processing apparatus as recited in claim 2, wherein a measurement value of a temperature sensor which measures a temperature of the substrate is also corrected by the measured emissivity value.

5. A method of producing a semiconductor device, comprising:

measuring emissivity of a device forming surface of a substrate at least before the substrate is heated; and controlling a heating operation of the substrate under a heating condition corresponding to the emissivity.

* * * * *